United States Patent [19]

Katsuoka et al.

[11] Patent Number: 4,915,775
[45] Date of Patent: * Apr. 10, 1990

[54] APPARATUS FOR ADJUSTING INITIAL POSITION OF MELT SURFACE

[75] Inventors: Nobuo Katsuoka, Takasaki; Yoshihiro Hirano, Annaka; Munenori Tomita, Annaka; Atsushi Ozaki, Annaka, all of Japan

[73] Assignee: Shin-Etsu Handotai Company, Ltd., Tokyo, Japan

[*] Notice: The portion of the term of this patent subsequent to Dec. 27, 2005 has been disclaimed.

[21] Appl. No.: 222,438

[22] Filed: Jul. 21, 1988

[30] Foreign Application Priority Data

Jul. 21, 1987 [JP] Japan .................. 62-181722

[51] Int. Cl.$^4$ .................. C30B 15/70; C30B 15/30; C30B 15/00; C30B 15/26
[52] U.S. Cl. .................. 422/249; 156/601; 156/608; 156/617.1; 422/248
[58] Field of Search .................. 156/601, 617.1, 608; 422/248, 249, 106, 107, 108

[56] References Cited

U.S. PATENT DOCUMENTS

| | | | |
|---|---|---|---|
| 3,980,438 | 9/1976 | Castonguay et al. | 23/273 |
| 3,998,598 | 12/1976 | Bonora | 23/273 |
| 4,207,293 | 6/1980 | Scholl et al. | 422/249 |
| 4,428,783 | 1/1984 | Gessert | 156/608 |
| 4,512,954 | 4/1985 | Matsui | 422/106 |
| 4,794,263 | 12/1988 | Katsuoka et al. | 422/249 |

OTHER PUBLICATIONS

Toshiba, "System for Pulling Up Single Crystal", *Patent Abstracts of Japan*, vol. 11, No. 297, (Sep. 25, 1987).
Fujitsu, "Single Crystal Growing Apparatus", *Patent Abstracts of Japan*, vol. 8, No. 134, (Jun. 21, 1984).
Toshiba, "Apparatus for Preparing Single Crystal", *Patent Abstracts of Japan*, vol. 9, No. 134, (Jun. 8, 1985).
Toshiba, "Manufacture of Single Crystal", *Patent Abstracts of Japan*, vol. 9, No. 171, (Jul. 16, 1985).

*Primary Examiner*—Gary P. Straub
*Assistant Examiner*—M. Franklin
*Attorney, Agent, or Firm*—Browdy and Neimark

[57] ABSTRACT

A melt-surface initial position adjusting apparatus which is suitable for use in a monocrystal growing system employing the Czochralski method to adjust the vertical position of the melt surface before the growing of a monocrystal. The apparatus can ensure a highly precise measurement of a crystal-diameter measuring device, thereby enabling a reduction in the costs of producing a monocrystal bar. Before the growing of a crystal, the vertical position (H) of the surface (16A) of a melt within a crucible is measured. The crucible is moved vertically on the basis of the measured value in such a manner as to maintain the distance (L) between the melt surface (16A) and an image sensor (28) for measuring the crystal diameter at a predetermined value.

7 Claims, 2 Drawing Sheets

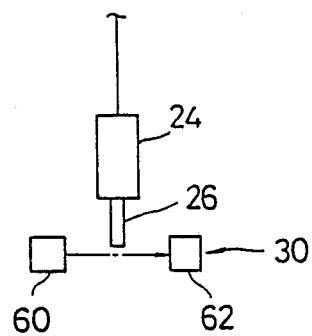
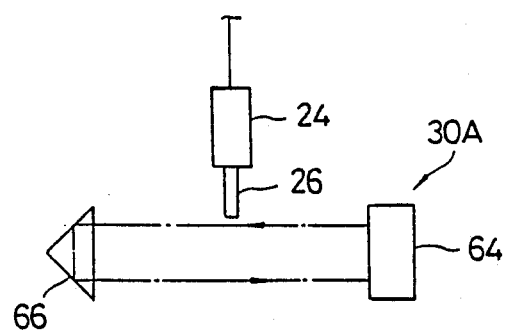
FIG. 2  FIG. 3
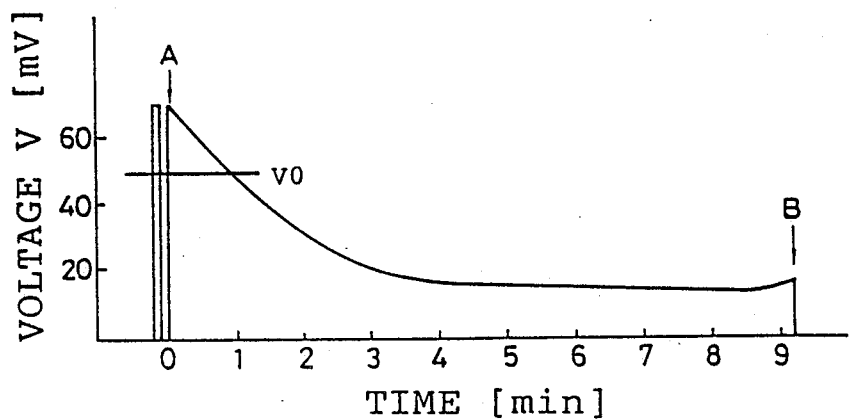
FIG. 4

APPARATUS FOR ADJUSTING INITIAL POSITION OF MELT SURFACE

BACKGROUND OF THE INVENTION

1. Field of the Invention

The present invention relates to an apparatus for adjusting the initial position of the surface of a melt, which is suitable for use in a monocrystal growing system employing the Czochralski method to adjust the vertical position of the surface of the melt before the growing of a monocrystal.

2. Description of the Prior Art

A cylindrical bar of silicon monocrystal obtained by the Czochralski method is usually subjected to a grinding process before it is sliced into wafers for making of, for instance, integrated circuit devices. In the grinding process, the outer peripheral surface of the silicon monocrystal bar is ground until the predetermined diameter is attained. Although it is naturally desired that the reduction in diameter caused by the grinding should be minimized in terms of economy, this minimization can be difficult to achieve as desired. In particular, a silicon monocrystal bar obtained by the Czochralski method has an increasingly large diameter (e.g., 158 mm) in recent years, and therefore the proportion of the volume of the material removed from the bar becomes inevitably larger than it was before even if the reduction in diameter is the same, resulting in an undesirable increase in production cost. For instance, even if the reduction in diameter is only 1 mm, the volume of the material removed from an unground bar of 600 mm in length and 158 mm in diameter is 298 cm$^3$. Since there have been strong demands for lowered production costs particularly in recent years, it is considered to be very advantageous to enable a minimization of the reduction in diameter, particularly with respect to a monocrystal bar of the above-described type, which is expecially costly and precious.

The reduction in diameter can be lessened by, for instance, improving the quick-response performance and the stability of control over the crystal diameter. It can also be lessened by improving the level of precision of a device used in the monocrystal growing system to measure the crystal diameter.

The initial value of the depth of a melt within a quartz crucible has hitherto been calculated by measuring the weight of the silicon polycrystal before it is heated and melted, and by using the specific gravity of the melt.

However, since it is often the case with a quartz crucible that, although its outer diameter is precisely determined, its inner diameter tends to be varied by factors during manufacture. Besides, its inner diameter is also affected by certain factors during use: part of the wall of the crucible dissolves into the melt on its inside, enlarging the inner diameter. For these reasons, the depth value calculated in the conventional manner sometimes has errors on the order of ±3 mm. These error levels cause undesired deviations of about 0.3 mm from the theoretical value of the crystal-diameter measurement.

SUMMARY OF THE PRESENT INVENTION

In view of the circumstances described above, it is an object of the present invention to provide an apparatus for adjusting the initial position of the melt surface, which is capable of ensuring that a crystal-diameter measuring device can measure the diameter of a crystal with a high level of precision, and which is thus capable of reducing the costs of producing a monocrystal bar.

To this end, according to the present invention, there is provided an apparatus for adjusting the initial position of the surface of a melt, which is suitable for use in a monocrystal growing system employing the Czochralski method, comprising a melt-surface initial position measuring device for measuring the vertical position of the surface of a melt within a crucible; and means for vertically moving the crucible on the basis of a value of the vertical position which has been measured before the growing of a crystal, in such a manner that the distance between the surface of the melt and an image sensor for measuring the diameter of the crystal is maintained at a predetermined value.

BRIEF DESCRIPTION OF THE DRAWINGS

FIGS. 1 to 4 illustrate embodiments of the present invention, wherein

FIG. 1 is an illustration schematically showing the entire structure of a melt-surface initial position adjusting apparatus in accordance with a first embodiment of the present invention;

FIG. 2 is an illustration showing the structure of a reference position detector;

FIG. 3 is an illustration showing the structure of a reference position detector of a melt-surface initial position adjusting apparatus in accordance with a second embodiment of the present invention; and FIG. 4 is a graph showing change in the voltage V across the terminals of a resistor 48 as time passes during the growing of a crystal.

DESCRIPTION OF THE PREFERRED EMBODIMENTS

Figure 1:
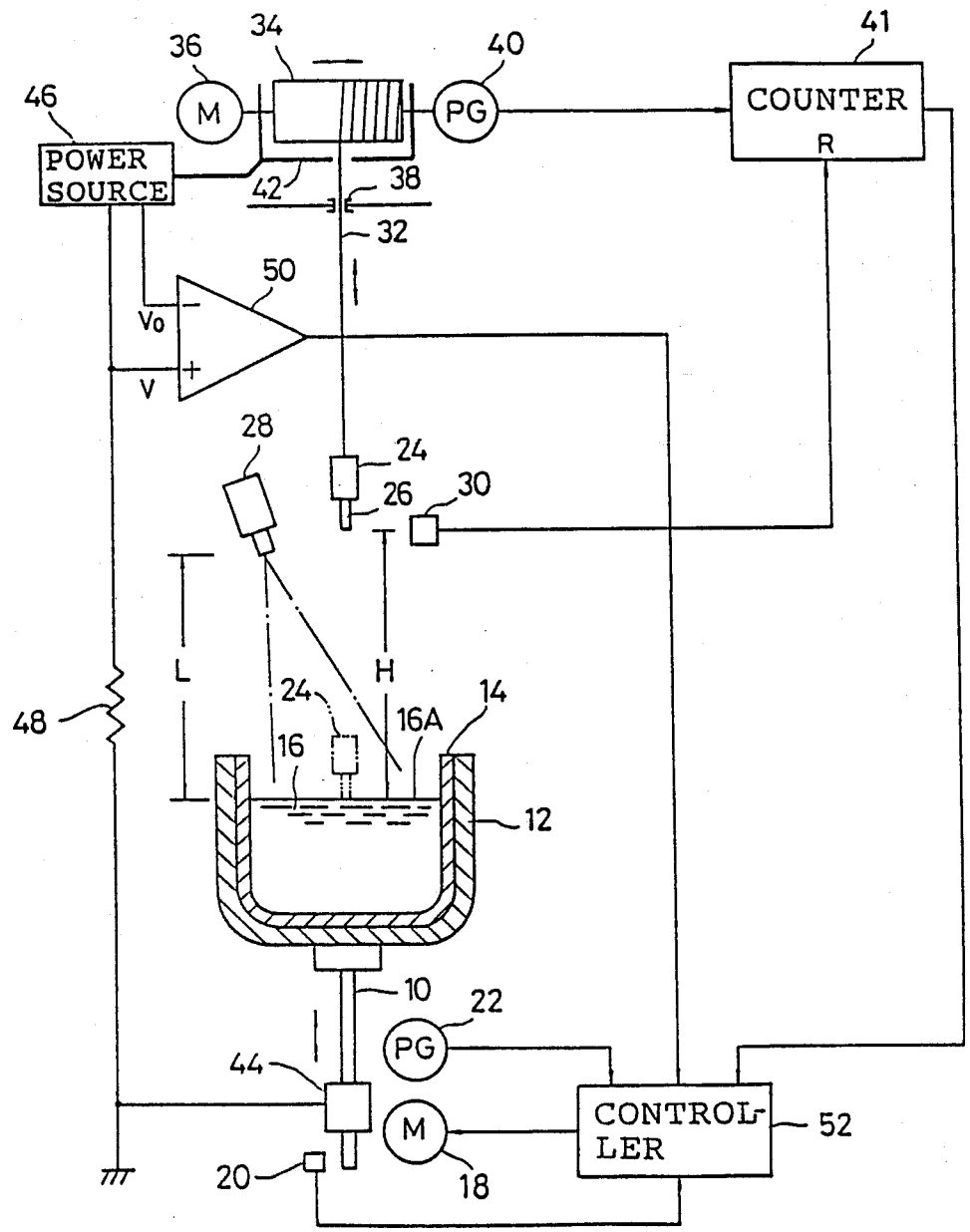

Certain embodiments of the present invention will be described hereunder with reference to the drawings.

FIG. 1 schematically shows the structure of a melt-surface initial position adjusting apparatus of the present invention. A quartz crucible 14 receiving a predetermined weight of polycrystal silicon is fitted in a graphite crucible 12 that is supported by the upper end of a crucible moving shaft 10. The polycrystal silicon is heated by a heater (not shown) surrounding the graphite crucible 12 so that it is melted to form a melt 16. The crucible moving shaft 10 is moved vertically by the operation of a motor 18 so that the upper surface of the melt 16 (i.e., a melt surface 16A) is adjusted to be positioned at a predetermined position. The vertical position of the crucible moving shaft 10 is detected by a lower-limit position detector 20 and by a pulse generator 22 which outputs a number of pulses proportional to the amount through which the crucible moving shaft 10 moves.

To grow a silicon monocrystal, the tip of a seed crystal 26 held by a seed crystal holder 24 is dipped into the melt 16 and then pulled up. The crystal diameter D at the boundary between the growing silicon monocrystal and the melt 16 is measured by processing a signal output by a TV camera 28 for industrial use.

However, if the distance L between the camera 28 and the melt surface 16A fluctuates, it is impossible to correctly measure the crystal diameter D.

In order to correctly measure the crystal diameter D, this embodiment provides an arrangement in which the distance H between the melt surface 16A and a reference position detector 30 disposed above the melt 16 is correctly measured, and, thereafter, the crucible moving shaft 10 is moved vertically in such a manner that the distance L is maintained at a predetermined value L0. This arrangement will be described below in detail.

A wire rope 32 is wound on a drum 34 in such a manner as to be disposed in a helical groove formed in the peripheral surface of the drum 34, with one end of the rope 32 being secured to the drum 34. The other end of the rope 32 is secured to the upper end of the seed crystal holder 24. The drum 34 is rotatively driven by a motor 36 and is also driven axially via a screw rod (not shown) that is rotated by the motor 36. With this arrangement, the wire rope 32 unwound from the drum 34 is suspended without bending in the horizontal direction and extends downward passing through a guide 38. Accordingly, if the amount of rotation of the drum 34 is measured, the amount of vertical movement of the wire rope 32 can be correctly measured.

The rotary shaft of the drum 34 is connected to the rotary shaft of a pulse generator 40 which outputs a number of pulses proportional to the amount of rotation of the drum 34 as well as signals indicative of the forward and backward rotation of the drum 34. Pulses and signals output from the pulse generator 40 are respectively supplied to the input terminal and the up/down control terminal of a counter 41. The counter 41 counts up or counts down the number of pulses supplied as the seed crystal 26 descends or ascends. The count of the counter 41 is cleared when the seed crystal 26 descends to a certain position at which its lower end is detected by the reference position detector 30.

FIG. 2 shows an example of the structure of the reference position detector 30. In this example, it is detected that the seed crystal 26 is at the reference position when light radiated from a light emitter 60 is blocked by the tip of the descending seed crystal 26 and thus stops reaching a light receiver 62. The light emitter 60 and the light receiver 62 are disposed, for instance, on a shutter (not shown) above a chamber in which the crucibles 12 and 14 are disposed. After the detection of the lower end of the seed crystal 26, the operation of the motor 36 is suspended, the shutter is opened, and the operation of the motor 36 is restarted, whereupon the seed crystal 26 descends further.

Electrical connection is always established between the seed crystal 26 and a base 42 supporting the drum 34, as well as between the melt 16 and a bearing 44 supporting the crucible moving shaft 10. Meanwhile, one output terminal of a DC power source 46 is connected to the base 42, and the other output terminal of the power source 46 is connected to the bearing 44 via a resistor 48. Accordingly, when the wire rope 32 is unwound and the seed crystal 26 is brought into contact with the melt 16, current flows through a circuit formed buy the above-mentioned members, to generate a voltage V across the terminals of the resistor 48. The voltage V is supplied to a comparator 50 to be compared thereby with a reference voltage V0 supplied to the comparator 50 from the DC power source 46. If the relationship of $V0<V$ is satisfied, the output voltage of the comparator 50 goes high.

The reference voltage V0 is determined by actually measuring, a plurality of times and under various conditions, values of the voltage V generated when the seed crystal 26 comes into contact with the melt 16, and it is set to a value at which $V>V0$ is always satisfied at the time of the contact.

FIG. 4 shows the results obtained by measuring change with time in the voltage V across the terminals of the resistor 48, using, as the power source 46, a DC power source having an output voltage of 12 V. In the drawing, A denotes the time at which the seed crystal 26 is dipped into the melt 16, whereas B denotes the time at which the tail of a grown crystal bar is separated from the melt 16.

A quartz crucible, such as the crucible 14, has conventionally been believed to be an electrical insulator. However, the present inventors have found from experiments that a quartz crucible exhibits electrical conductivity when it is at high temperatures above 1000° C. The conventional belief that a quartz crucible is an electrical insulator, together with the facts that the outer peripheral surface of a quartz crucible is usually rough and its dimensions often vary, has led us to believe that the electrical contact is insufficient between the quartz crucible and a graphite crucible, such as the crucible 12, in which the quartz crucible is fitted. For these reasons, when a DC voltage of only 12 V was applied, we were surprised to observe that a current of as strong as 50 mA flowed.

Referring again to FIG. 1, a signal output from the comparator 50 is supplied to a controller 52. When the seed crystal 26 is brought into contact with the melt 16 and the relationship $V>V0$ is detected, the controller 52 operates to rotate the motor 36 in the reverse direction so as to slightly wind up the wire rope 32, thereby separating the seed crystal 26 from the melt 16. Further, at the time at which the relationship $V>V0$ is detected, the controller 52 operates to read the count supplied from the counter 41 and compare the read count with a set value stored in the controller 52. Based on the result of this comparison, the controller 52 starts the motor 18, while counting up the pulses output from the pulse generator 22. In this way, the crucible moving shaft 10 is vertically moved so that the distance L between the TV camera 28 and the melt surface 16A becomes equal to the predetermined value L0.

Although the location at which the reference position detector 30 is provided cannot be freely chosen due to limitations set by factors such as the structure of the crystal bar puller, it is preferred that the detector 30 be located as close as possible to the melt surface 16A. For instance, if the distance between the drum 34 and the melt surface 16A is about 3 m and the distances H and L are each about 1 m, the provision of the detector 30 at such a preferable location makes it possible to measure the distance H with a small error that is about one third of what is possible where the detector 30 is disposed in the vicinity of the guide 38.

Subsequently, the descending of the seed crystal 26 is restarted to dip it into the melt 16, then the seed crystal 26 is pulled up to grow a silicon monocrystal. During this pulling-up operation, the crucible moving shaft 10 is moved vertically in such a manner that the melt surface 16A is always positioned at a predetermined position. The vertical position of the melt surface 16A during the operation of growing a monocrystal is calculated from a reduction rate of the melt 16 that is calculated by integrating with respect to time the product of the cross-sectional area of the growing monocrystal and the speed at which the seed crystal 26 is pulled up from the melt surface 16A, as well as from the rate at which the wire rope 32 is wound up and the rate at which the crucible moving shaft 10 is moved upward. The distance L between the melt surface 16A and the camera 28 is calculated on the basis of the thus calculated position of the melt surface 16A.

The relationship between the diameter D of the crystal actually growing and the diameter d of an image crystal displayed by the camera 28 can be expressed by, e.g., the following approximation expression:

$$D = (\alpha + \beta X + \gamma X^2) d$$

where $\alpha$, $\beta$, and $\gamma$ are constants, $X = L - L0$, and $X/L < 1$.

It was found that, if the crystal diameter D was measured by processing signals output from the industrial-use TV camera 28 according to the above formula, the measurement deviation was reduced by about 0.3 mm from the deviation conventionally involved. Since various other factors cause increases in the measurement deviation, if suitable measures are taken to prevent increases by individual factors, it is possible to reduce the measurement deviation by a total reduction on the order of 1 mm.

A second embodiment of the present invention will now be described with reference to FIG. 3. An apparatus in accordance with this embodiment has the same structure as that of the previous embodiment, except for the provision of a different reference position detector 30A.

The reference position detector 30A has a light emitter/receiver 64 and a right-angle prism 66 which are disposed on either side of the path along which the seed crystal 26 descends.

Light emitted from a light-emitting portion of the light emitter/receiver 64 is totally reflected twice by the right-angle prism 66 so that its direction is changed through 180 degrees, then reaches a light-receiving portion of the device 64. When the lower end of the seed crystal 26 enters the optical path of the light, it is detected that the seed crystal 26 is at the reference position.

Although in the foregoing embodiments the wire rope 32 is used, a shaft may be used instead of the wire rope 32.

Further, an AC power source may be used instead of the DC power source 46.

Further, although in the foregoing embodiments the industrial-use TV camera 28 used as an image sensor for measuring the crystal diameter has a pickup tube, a solid-state image sensor such as a CCD may alternatively be used.

Still further, although in the foregoing embodiments the apparatus of the present invention is applied to a silicon monocrystal growing system, the present invention is not limited thereto. The apparatus of the present invention is applicable to systems for growing monocrystals of various types, insofar as the system employs the Czochralski method.

The apparatus in accordance with the present invention ensures that the crystal-diameter measuring device measures the relevant dimension with an enhanced level of precision. This feature of the apparatus enables the outer peripheral surface of the resultant crystal bar to be ground by a lesser reduction in diameter during a grinding process before a process of slicing the bar into wafers, thus enabling a reduction in production costs.

We claim:

1. An apparatus for adjusting the initial position of the surface of the melt, which is suitable for use in a monocrystal growing system employing the Czochralski method, comprising:

a melt-surface initial position measuring device for measuring the vertical position (H) of the surface (16A) of a melt (16) within a crucible (14); and means (18, 22, 52) for vertically moving said crucible (14) to a desired initial position selected on the basis of measurement of said melt-surface initial position by said melt-surface initial position measuring device;

wherein said melt-surface initial position measuring device comprises:

electrical contact detecting means (46, 48, 50) for detecting the electrical contact between a seed crystal (26) and said melt (16);

reference position detecting means (30, 30A) disposed above said melt (16) for detecting that the lower end of said seed crystal (26) is at a reference position;

pulse generating means (40) for outputting a number of pulses proportional to the distance through which said seed crystal (26) descends; and pulse counting means (41) for counting the number of pulses generated while said seed crystal (26) descends from said reference position to the position at which said seed crystal (26) is brought into electrical contact with said melt (16), and for outputting a vertical position of the surface (16A) of said melt (16).

2. An apparatus for adjusting the initial position of the surface of a melt according to claim 1, wherein said electrical contact detecting means comprises:

a resistor (48);

a power source (46) applying a predetermined voltage via said resistor to a circuit connecting said seed crystal (26) and said melt (16); and a comparator (50) for comparing a voltage V across the terminals of said resistor with a reference voltage V0, the output value of said comparator being used to detect that said seed crystal (26) is brought into contact with said melt (16).

3. An apparatus for adjusting the initial position of the surface of a melt according to claim 2, wherein said power source (46) is a direct-current voltage source.

4. An apparatus for adjusting the initial position of the surface of a melt according to claim 1, wherein said reference position detecting means comprises:

a light emitter (60); and a light receiver (62) for receiving light radiated from said light emitter (60), said light emitter (60) and said light receiver being disposed as close as possible to the surface (16A) of said melt (16) and in such a manner that said seed crystal (26) is allowed to cross the optical path of the light propagating from said light emitter (60) to said light receiver (62) when said seed crystal (26) descends.

5. An apparatus for adjusting the initial position of the surface of a melt according to claim 1, wherein said reference position detecting means comprises:

a light emitting/receiving means (64) in which a light emitting element and a light receiving element are integrated; and a reflecting means (66) disposed in opposition to said light emitting/receiving means for reflecting light radiated from said light emitting element toward said light receiving element.

6. An apparatus for adjusting the initial position of the surface of a melt according to claim 1, wherein said pulse generating means outputs one pulse each time a drum (34) rotates through a predetermined small angle, said drum (34) supporting a wire (32) which is wound thereon and has one end thereof connected to a holder (24) holding said seed crystal (26).

7. An apparatus for adjusting the initial position of the surface of a melt according to claim 1, wherein the count of said pulse counting means is cleared when said reference position detecting means (30, 30A) detects the lower end of said seed crystal (26).

\* \* \* \* \*